United States Patent
Kashiwagi

(10) Patent No.: US 8,179,117 B2
(45) Date of Patent: May 15, 2012

(54) PULSE DETECTION DEVICE AND PULSE DETECTION METHOD

(75) Inventor: Yoshiki Kashiwagi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 468 days.

(21) Appl. No.: 12/437,925

(22) Filed: May 8, 2009

(65) Prior Publication Data

US 2009/0289684 A1 Nov. 26, 2009

(30) Foreign Application Priority Data

May 20, 2008 (JP) ................................ 2008-131543

(51) Int. Cl.
*G01R 23/16* (2006.01)
(52) U.S. Cl. .................................................. 324/76.12
(58) Field of Classification Search ................ 324/76.12
See application file for complete search history.

(56) References Cited

U.S. PATENT DOCUMENTS

| | | | | |
|---|---|---|---|---|
| 5,256,949 A * | 10/1993 | Reichard et al. | ......... | 318/400.01 |
| 6,756,827 B2 * | 6/2004 | Konuk et al. | ................. | 327/116 |
| 7,038,953 B2 * | 5/2006 | Aoki | ........................ | 365/189.05 |
| 7,579,875 B2 * | 8/2009 | Kato | ................................ | 326/86 |
| 2007/0216359 A1 * | 9/2007 | Arai et al. | ..................... | 320/130 |
| 2008/0094918 A1 * | 4/2008 | Fujizoe | .................... | 365/189.07 |

FOREIGN PATENT DOCUMENTS

JP 2007-251609 A 9/2007

* cited by examiner

*Primary Examiner* — Jeff Natalini
(74) *Attorney, Agent, or Firm* — Sughrue Mion, PLLC

(57) ABSTRACT

A pulse detection device detects a pulse signal having an intermediate potential in a predefined period. Furthermore, the pulse detection device includes a signal fixing section that fixes the intermediate potential of the pulse signal at a low level or a high level. Furthermore, the signal fixing section is preferably a pull-down resistor or a pull-up resistor connected to an input signal line to which the pulse signal is input. Note that a pulse detection method may fix the intermediate potential of the pulse signal at a low level or a high level.

5 Claims, 9 Drawing Sheets

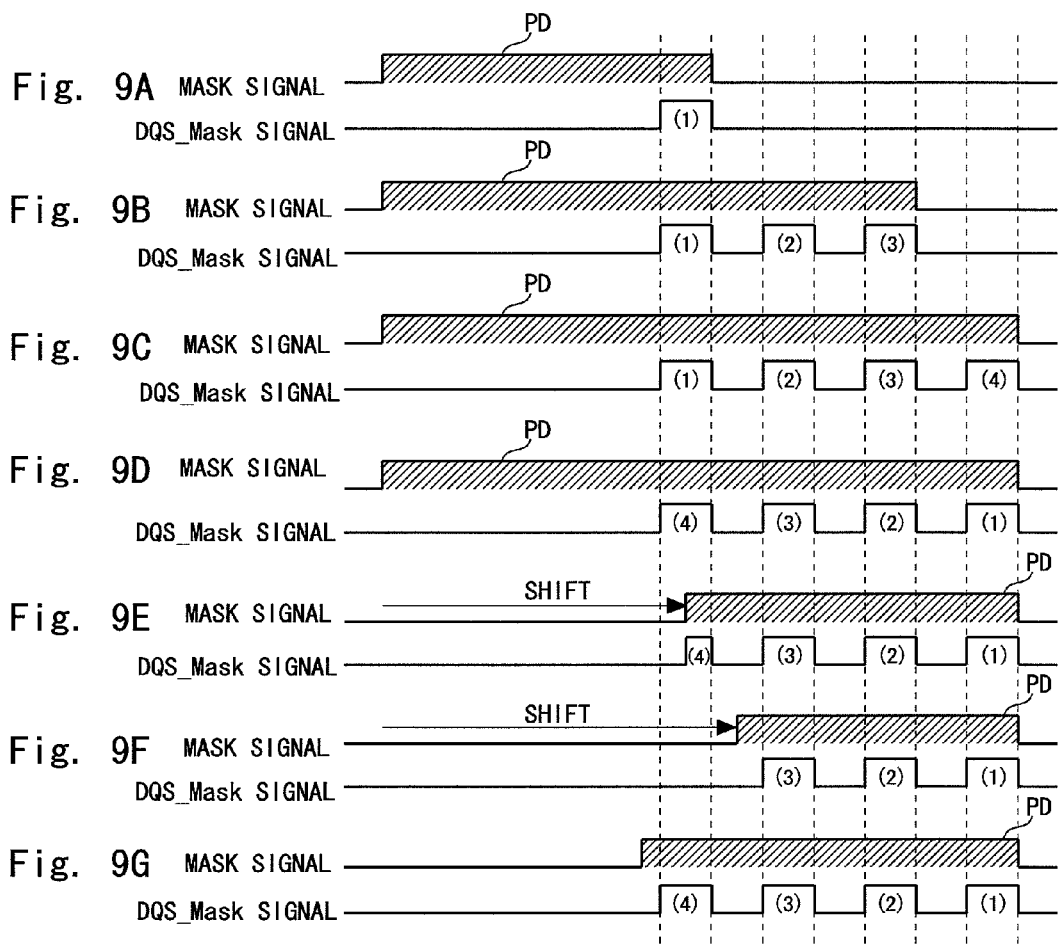

PULSE DETECTION DEVICE AND PULSE DETECTION METHOD

BACKGROUND

1. Field of the Invention

The present invention relates to a pulse detection device and a pulse detection method, in particular to a pulse detection device and a pulse detection method to detect a pulse signal having an intermediate potential in a predefined period.

2. Description of Related Art

As a related art, a pulse detection device that detects a pulse signal having an intermediate potential in a predefined period has been known. Furthermore, an interface circuit that detects that a signal from an external circuit is at an intermediate potential by comparing the potential of the external signal with a threshold potential that is different from the intermediate potential has been also known (for example, see Japanese Unexamined Patent Application Publication No. 2007-251609).

SUMMARY

However, the present inventors have found a following problem. In the above-mentioned pulse device in the related art, a common noise is sometimes mixed during the period during which the signal has an intermediate potential, so that the signal level is swung to a logical high level or low level, thus becoming unstable. Consequently, that pulse detection device could falsely detect a noise that swings to a logical high level as a pulse.

Meanwhile, the above-mentioned Japanese Unexamined Patent Application Publication No. 2007-251609 discloses the interface circuit that detects that a signal is at an intermediate potential by comparing that signal with a threshold potential that is different from the intermediate potential. However, it does not disclose any technical idea to detect a pulse signal with high precision by fixing the intermediate potential of the pulse signal at a low level or high level.

A first exemplary aspect of an embodiment of the present invention is a pulse detection device to detect a pulse signal having an intermediate potential in a predefined period, including a signal fixing section that fixes the intermediate potential of the pulse signal at a low level or a high level. In accordance with this exemplary aspect of the present invention, the intermediate potential of the pulse signal becomes stable since the intermediate potential is fixed at a low level or a high level, so that the pulse signal can be detected with high precision.

Furthermore, another exemplary aspect of an embodiment of the present invention is a pulse detection method for detecting a pulse signal having an intermediate potential in a predefined period, including fixing the intermediate potential of the pulse signal at a low level or a high level. In accordance with this exemplary aspect of the present invention, the intermediate potential of the pulse signal becomes stable since the intermediate potential is fixed at a low level or a high level, so that the pulse signal can be detected with high precision.

In an exemplary aspect, the present invention can detect a pulse signal with high precision.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 9A illustrates a decision process of a mask cancel period for a DQS signal in the control circuit of a pulse detection device in accordance with another exemplary embodiment of the present invention;

FIG. 9B illustrates a decision process of a mask cancel period for a DQS signal in the control circuit of a pulse detection device in accordance with another exemplary embodiment of the present invention;

FIG. 9C illustrates a decision process of a mask cancel period for a DQS signal in the control circuit of a pulse detection device in accordance with another exemplary embodiment of the present invention;

FIG. 9D illustrates a decision process of a mask cancel period for a DQS signal in the control circuit of a pulse detection device in accordance with another exemplary embodiment of the present invention;

FIG. 9E illustrates a decision process of a mask cancel period for a DQS signal in the control circuit of a pulse detection device in accordance with another exemplary embodiment of the present invention;

FIG. 9F illustrates a decision process of a mask cancel period for a DQS signal in the control circuit of a pulse detection device in accordance with another exemplary embodiment of the present invention; and FIG. 9G illustrates a decision process of a mask cancel period for a DQS signal in the control circuit of a pulse detection device in accordance with another exemplary embodiment of the present invention.

DETAILED DESCRIPTION OF THE EXEMPLARY EMBODIMENTS

[First Exemplary Embodiment]

Figure 1:
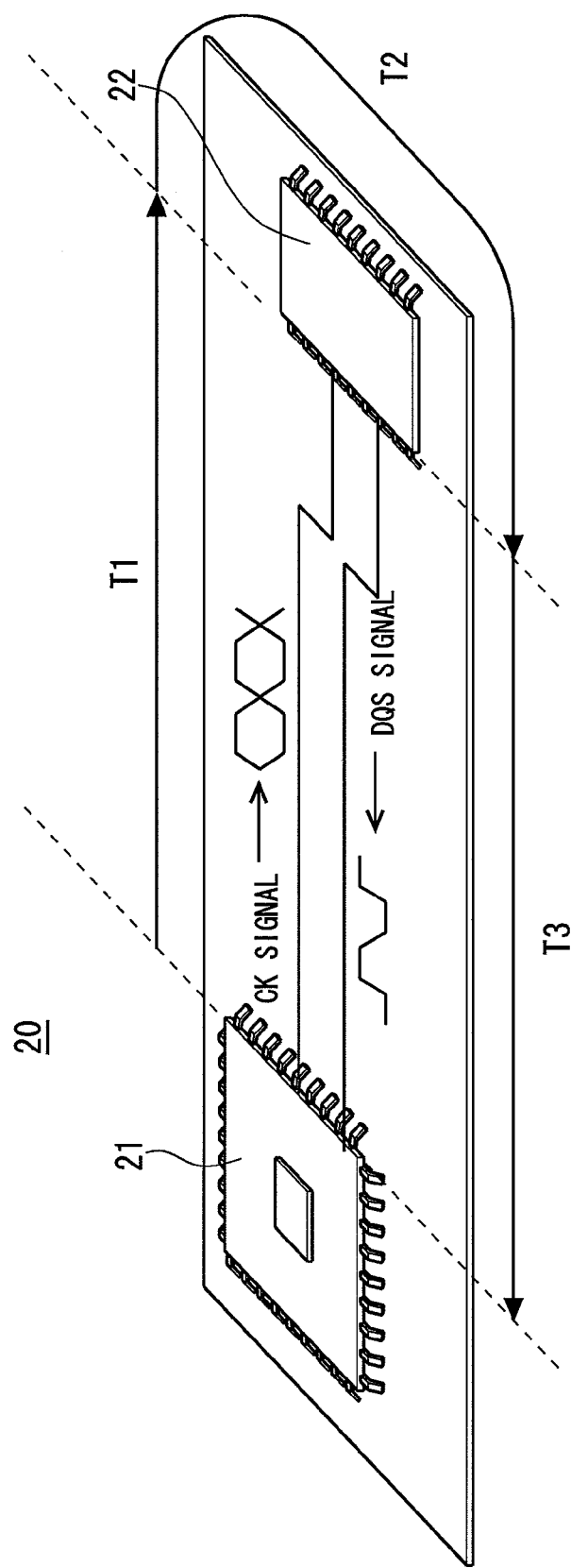
FIG. 1 shows a configuration example of an electronic circuit apparatus on which a pulse detection device in accordance with an exemplary embodiment of the present invention is mounted.

Best mode for carrying out the present invention is explained hereinafter by taking exemplary embodiments as examples with reference to the attached drawings. FIG. 1 shows a configuration example of an electronic circuit apparatus on which a pulse detection device in accordance with an exemplary embodiment of the present invention is mounted. Furthermore, FIG. 2 is a time chart illustrating an example of a READ operation in the electronic circuit apparatus shown in FIG. 1.

As shown in FIG. 1, an electronic circuit apparatus 20 includes an ASIC (Application Specific Integrated Circuit) 21 containing a pulse detection device 1 in accordance with an exemplary embodiment of the present invention, and a semiconductor storage device 22. The ASIC 21 generates a memory clock signal (CK signal) in synchronization with a system clock signal. Furthermore, the ASIC 21 outputs the generated CK signal to the semiconductor storage device 22.

Examples of the semiconductor storage device 22 include a DDR-SDRAM (Double Data Rate Synchronous Dynamic Random Access Memory) and a DDR2 or 3-SDRAM. These DDR-SDRAM and DDR2 or 3-SDRAM have a high-speed data transfer function, i.e., the so-called "DDR mode", with which data reading and writing can be performed in synchronization with a rising edge and a falling edge of a DQS signal.

Figure 2:
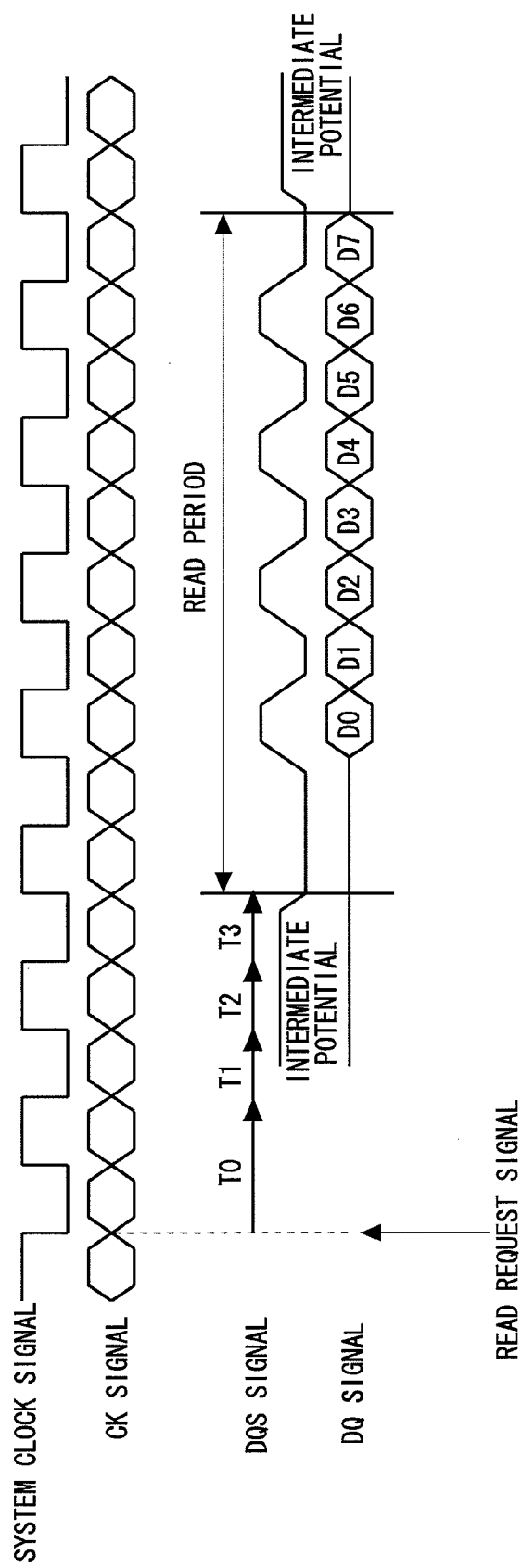
FIG. 2 is a time chart illustrating an example of a READ operation in the electronic circuit apparatus shown in FIG. 1.

As shown in FIG. 2, when the ASIC 21 performs a READ operation for the semiconductor storage device 22, the ASIC 21 outputs a READ request signal to the semiconductor storage device 22. When the semiconductor storage device 22 receives the READ request signal from the ASIC 21, the semiconductor storage device 22 sends a predefined data signal (DQ signal) D0-D7 to the ASIC 21 after a lapse of a predefined latency time (Read Latency) T0 (for example, after a lapse of a time corresponding to two pulses of the memory clock signal). At this point, the semiconductor storage device 22 also sends a DQS signal, which is in synchronization with the CK signal, to the ASIC 21 simultaneously with the DQ signal D0-D7.

Note that the ASIC 21 does not start the read operation of the DQ signal until the above-described latency time T0, a clock path delay T1, a DQS output delay T2, and a DQS path delay T3 have elapsed after the ASIC 21 outputs the READ signal. In the above explanation, the clock path delay T1 represents a delay caused in the circuit when the CK signal propagates to the semiconductor storage device 22. Furthermore, the DQS output delay T2 represents a delay caused in the circuit when the semiconductor storage device 22 outputs the DQS signal for the ASIC 21. Furthermore, the DQS path delay T3 represents a delay caused in the circuit when the DQS signal propagates to the ASIC 21.

Furthermore, the semiconductor storage device 22 sends the DQ signal in synchronization with a rising (Rise) edge and a falling (Fall) edge of the DQS signal. In this way, the ASIC 21 can read the DQ signal in synchronization with the rising edge and the falling edge of the DQS signal. That is, the duration between the rising edge and the falling edge of the DQS signal becomes a READ period during which the ASIC 21 performs the reading operation.

In this READ period, the DQS signal is in an active state with a logical high level "1" or a logical low level "0". Meanwhile, in a predefined period other than this READ period, the DQS signal becomes a non-active state (high-impedance state), in which the potential of the signal line becomes, usually, an intermediate potential. Note that a certain period immediately after the beginning of the READ period of the DQS signal is a period called "preamble" during which the DQS signal has a constant low level potential, and a certain period immediately before the end of the READ period is a period called "postamble" during which the DQS signal also has a constant low level potential.

Figure 3:
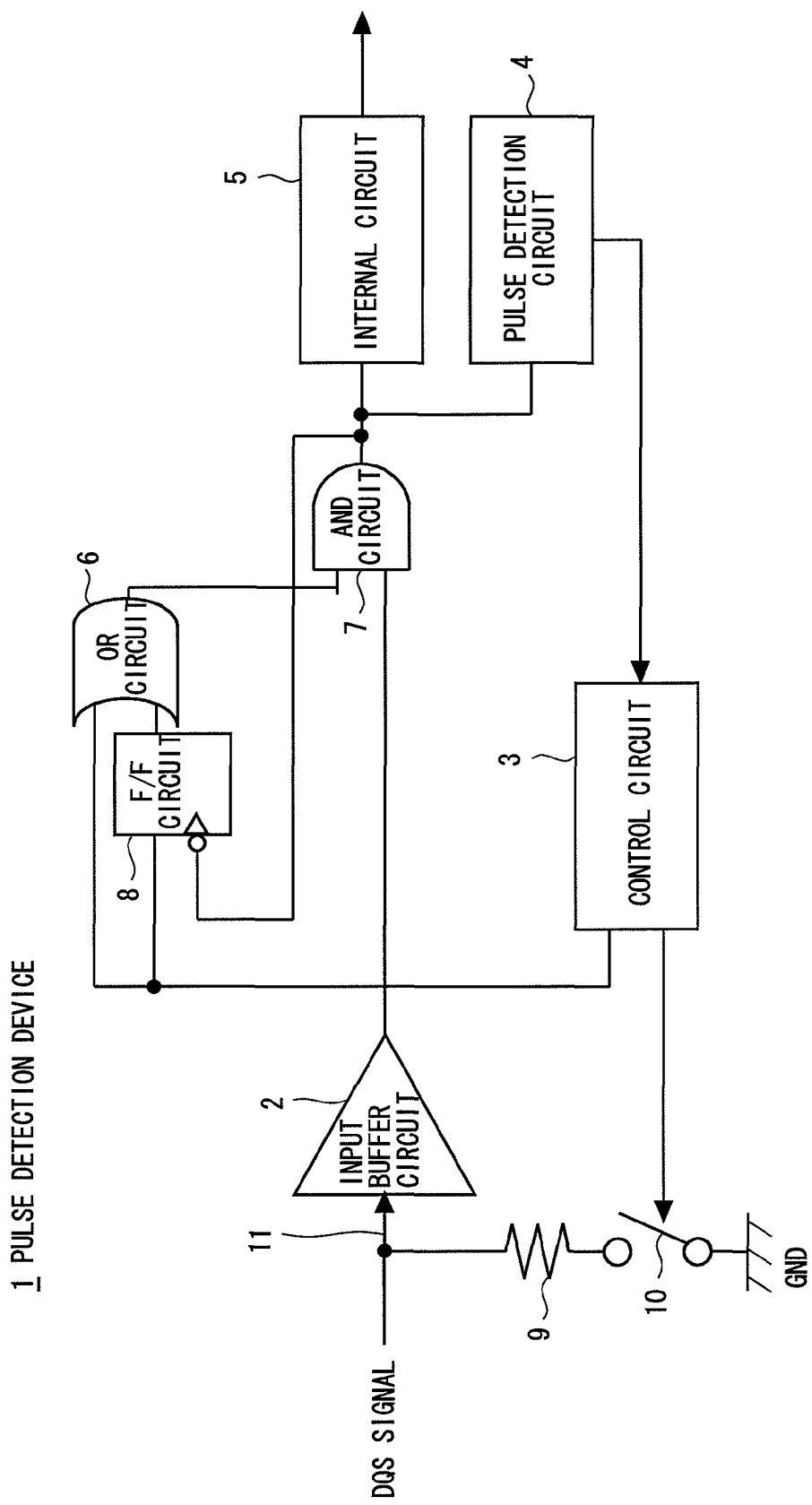
FIG. 3 is a block diagram illustrating an example of a system configuration of a pulse detection device in accordance with an exemplary embodiment of the present invention.

FIG. 3 is s a block diagram illustrating an example of a system configuration of a pulse detection device 1 in accordance with an exemplary embodiment of the present invention. The pulse detection device 1 in accordance with this exemplary embodiment of the present invention includes an input buffer circuit 2, a control circuit 3, a pulse detection circuit 4, an internal circuit 5, a logical addition (OR) circuit 6, a logical multiplication (AND) circuit 7, a flip-flop (F/F) circuit 8, a pull-down resistor 9, and a select switch 10.

An input signal line 11 is connected to the input side of the input buffer circuit 2, and the output side of the input buffer circuit 2 is connected to the input side of the logical multiplication circuit 7. The output side of the control circuit 3 is connected to the input side of the flip-flop circuit 8 and the input side of the logical addition circuit 6, and to the select switch 10. The output side of the logical multiplication circuit 7 is connected to the input side of the flip-flop circuit 8, the input side of the internal circuit 5, and the input side of the pulse detection circuit 4. The output side of the flip-flop circuit 8 is connected to the input side of the logical addition circuit 6. The output side of the logical addition circuit 6 is connected to the input side of the logical multiplication circuit 7. The output side of the pulse detection circuit 4 is connected to the input side of the control circuit 3. The input signal line 11 is also connected to one end of the pull-down resistor 9, and the other end of the pull-down resistor 9 is connected to a ground portion GND through the select switch 10.

A DQS signal output from the semiconductor storage device 22 is input to the input buffer circuit 2 through the input signal line 11. The input buffer circuit 2 performs an amplification and a related operation on the DQS signal, and outputs the resultant DQS signal to the logical multiplication circuit 7. The select switch 10 can switch the connection state between the input signal line 11 and the ground portion GND between a connected state and a non-connected state. The internal circuit 5 performs internal operations such as arithmetic operations.

The pulse detection circuit 4 counts the number of pulses (the number of logical high level "1") of the DQS signal output from the logical multiplication circuit 7. The pulse detection circuit 4 counts the number of pulses of the DQS signal in a READ period, and outputs the counted pulse number of the DQS signal to the control circuit 3.

Figure 4:
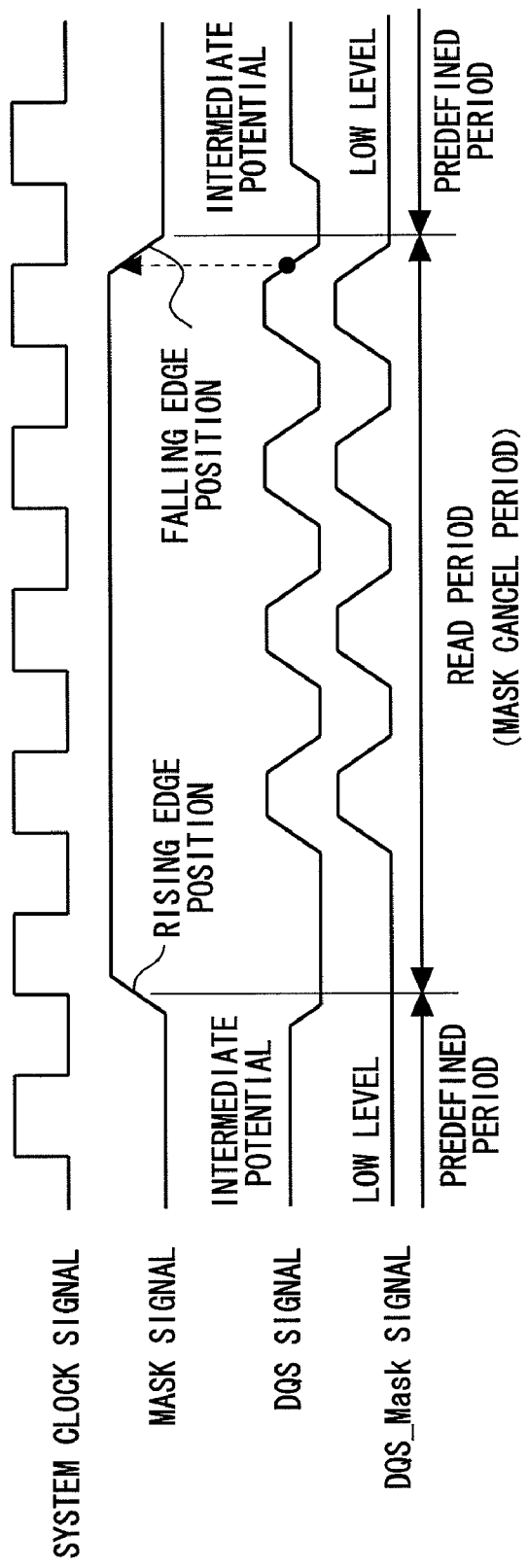
FIG. 4 is a figure illustrating a rising edge and a falling edge of a mask signal, and a READ period that becomes a mask cancel period.

The control circuit (mask position decision section) 3 generates a mask signal, which is used to carry out a mask process for the DQS signal, based on the number of pulses output from the pulse detection circuit 4, and outputs the generated mask signal to the flip-flop circuit 8 and the logical addition circuit 6. Note that the control circuit 3 determines a mask position in which a mask process is carried out for the DQS signal by adjusting the positions of the rising edge (Rise) and the falling edge (Fall) of the mask signal in synchronization with a system clock signal (FIG. 4).

Furthermore, the control circuit 3 controls the output of the mask signal such that the number of pulses of the DQS signal that is counted by the pulse detection circuit 4 becomes equal to the predefined number N1 (e.g., four pulses). Furthermore, the control circuit 3 controls the output of the mask signal such that a period other than the READ period of the DQS signal becomes the mask position. In other words, the control circuit 3 controls the output of the mask signal such that a predefined period during which the DQS signal has an intermediate potential (unfixed signal) becomes the mask position, and that the READ period becomes a mask cancel period PD.

Note that the above-described predefined number N1 for the DQS signal is established in advance based on the specifications of the semiconductor storage device 22. Furthermore, the control circuit 3 controls the output timing of the mask signal with taking above-described latency time T0, and delays T1, T2, and T3 into consideration. For example, the control circuit 3 controls the output timing of the mask signal such that the falling edge position of the mask signal is synchronized with the falling edge of the DQS signal. Furthermore, the mask signal output from the control circuit 3 is input to the logical multiplication circuit 7 through the flip-flop circuit 8 and the logical addition circuit 6. Then, the logical multiplication circuit 7 combines the input DQS signal with the mask signal and outputs the resultant DQS signal on which the mask process is performed (DQS_Mask signal). In this way, the DQS signal is fixed at a low level in the predefined period during which the DQS signal originally has the intermediate potential.

The control circuit 3 also controls the connection state of the select switch 10 by sending a control signal to the select switch 10. For example, the control circuit 3 controls the select switch 10 to the connected state by sending a control signal to the select switch 10. In this way, the pull-down resistor 9 and the input signal line 11 are connected to the ground portion GND, so that the pull-down resistor 9 becomes the On-state. On the other hand, the control circuit 3 also controls the select switch 10 to the non-connected state by sending a control signal to the select switch 10. In this way, the pull-down resistor 9 and the input signal line 11 are disconnected from the ground portion GND, so that the pull-down resistor 9 becomes the Off-state.

Figure 5:
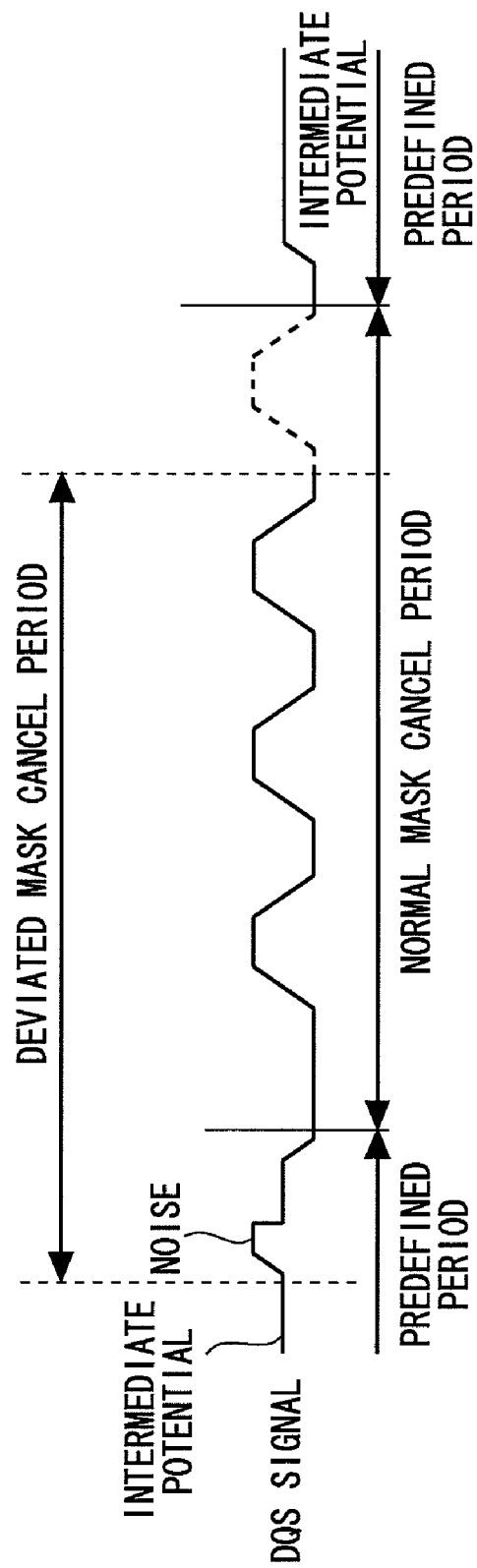
FIG. 5 shows an example state where a pulse detection device in the related art falsely detects a noise as a pulse and thereby a deviation is caused in the mask cancel period.

Meanwhile, a pulse detection device in the related art counts the number of pulses of the DQS signal, which has an intermediate potential in a predefined period. Therefore, for example, a common noise is sometimes mixed during the predefined period during which the signal has the intermediate potential, so that the signal level is swung to a logical high level or low level, thus becoming unstable. Consequently, the pulse detection device could falsely detect a noise that swings to the logical high level as a pulse (FIG. 5). Because of this false detection, for example, a deviation could be caused in the mask cancel period.

By contrast, a pull-down resistor 9 is connected to the input signal line 11 to which the DQS signal is input in the pulse detection device 1 in accordance with an exemplary embodiment of the present invention. In this way, the DQS signal is fixed at a low level in a predefined period during which the DQS signal originally has an intermediate potential, and thereby the DQS signal becomes stable. Accordingly, the pulse detection device 1 can count the number of pluses of the DQS signal with high precision.

Furthermore, the pull-down resistor 9 is connected to the ground portion GND through the select switch 10. Then, when the pulse detection circuit 4 is to count the number of pulses of the DQS signal, the control circuit 3 controls the select switch 10 to the connected state and controls the pull-down resistor 9 to the On-state. On the other hand, when the pulse detection circuit 4 is not counting the number of pulses of the DQS signal, the control circuit 3 controls the select switch 10 to the non-connected state and controls the pull-down resistor 9 to the Off-state.

In this way, the pull-down resistor 9 can be disconnected from the input signal line 11 of the DQS signal only when the pulse detection circuit 4 is not counting the number of pulses of the DQS signal. Therefore, it can eliminate such an adverse effect that the waveform of the DQS signal becomes dull by the pull-down resistor 9. That is, it becomes possible to count the number of pulses of the DQS signal with high precision while maintaining the waveform of the DQS signal at an excellent condition.

Figure 6:
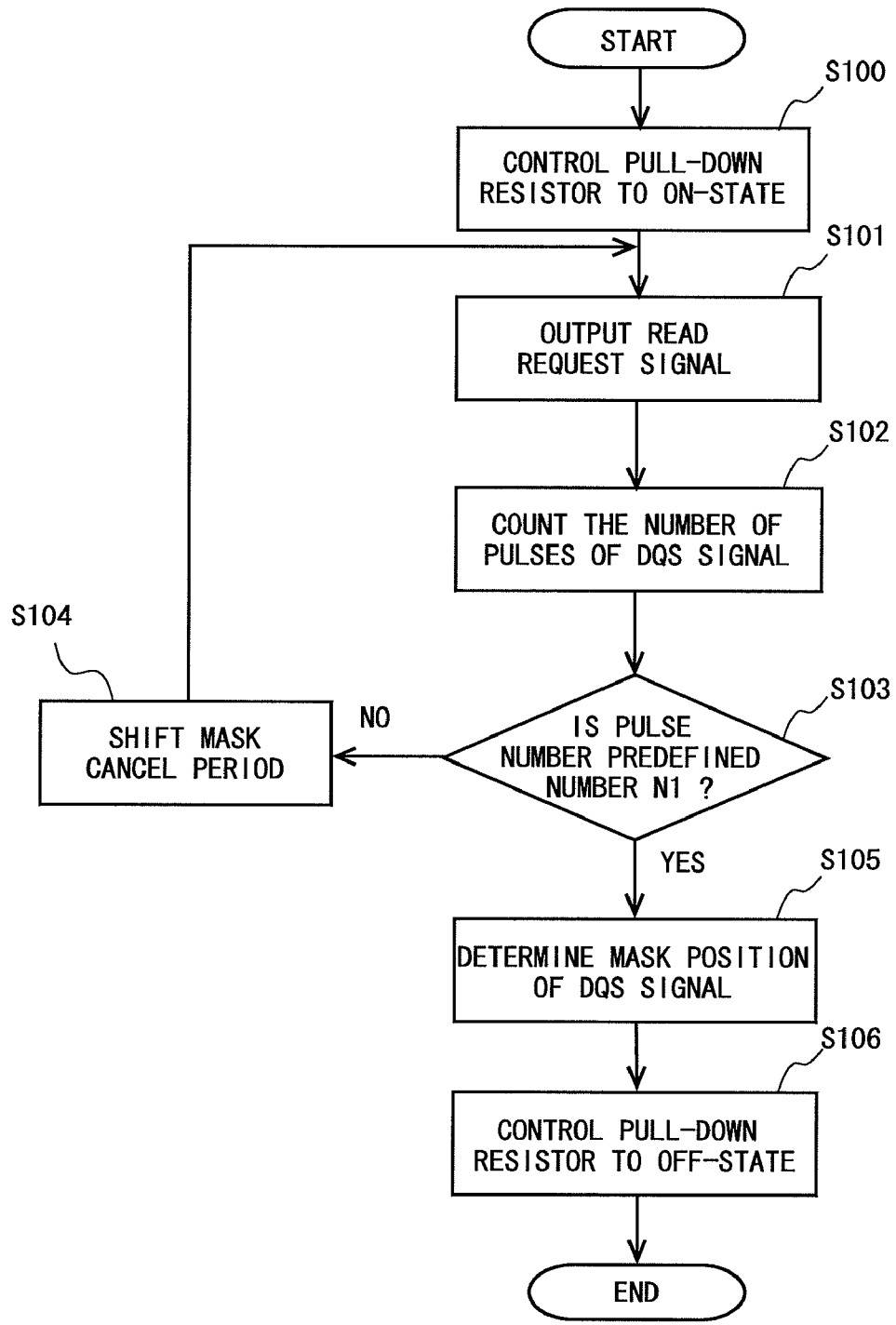
FIG. 6 is a flowchart illustrating an example of a pulse detection device and a pulse detection method in accordance with an exemplary embodiment of the present invention.

Next, a pulse detection method in a pulse detection device 1 in accordance with an exemplary embodiment of the present invention is explained hereinafter in detail. FIG. 6 is a flowchart illustrating an example of a pulse detection device 1 and a pulse detection method in accordance with an exemplary embodiment of the present invention.

Firstly, the control circuit 3 controls the select switch 10 to the connected state, so that the pull-down resistor 9 is controlled to the On-state (signal fixing step) (step S100). In this way, the connection state between the input signal line 11 of the DQS signal and the ground portion GND is brought to the connected state, so that the DQS signal is fixed at the low level during the predefined period during which the DQS signal originally has an intermediate potential, and thereby the DQS signal becomes stable.

Next, the ASIC 21 outputs a READ request signal to the semiconductor storage device 22 (step S101). Then, the pulse detection circuit 4 counts the number of pulses of the DQS signal (DQS_Mask signal) output from the logical multiplication circuit 7 based on this READ request signal (pulse detection step) (step S102), and outputs the counted number to the control circuit 3.

After that, the control circuit 3 determines whether or not the number of pulses of the DQS signal from the pulse detection circuit 4 is equal to a predefined number N1 (for example, four pulses) (step S103). When the control circuit 3 determines the number of pulses of the DQS signal from the pulse detection circuit 4 is not equal to the predefined number N1 (No at step S103), the control circuit 3 shifts the mask cancel period PD of the mask signal by controlling the output timing of the mask signal (step S104), and the process returns to the above-described step S101. Note that the mask cancel period PD (pulse width) during which the mask process by the mask signal is cancelled has a fixed length (e.g., roughly the same width as that of the predefined number N1 of pulses of the DQS signal).

Figure 7:
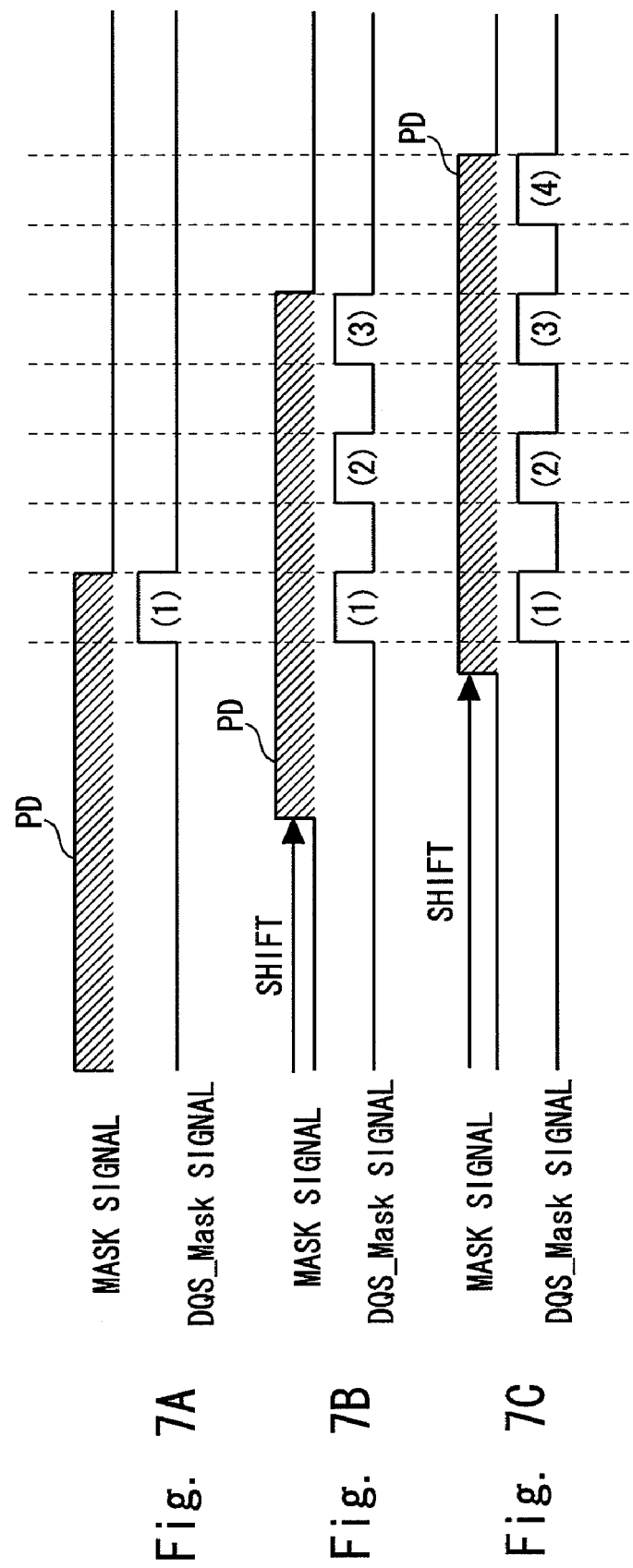
FIG. 7A illustrates a decision process of a mask cancel period for a DQS signal in the control circuit of a pulse detection device in accordance with an exemplary embodiment of the present invention.
FIG. 7B illustrates a decision process of a mask cancel period for a DQS signal in the control circuit of a pulse detection device in accordance with an exemplary embodiment of the present invention.
FIG. 7C illustrates a decision process of a mask cancel period for a DQS signal in the control circuit of a pulse detection device in accordance with an exemplary embodiment of the present invention.

For example, when the control circuit 3 determines that the number of the DQS_Mask signal counted by the pulse detection circuit 4 is one (FIG. 7A), the control circuit 3 shifts the mask cancel period PD (hatched area) to the right in FIG. 7A by delaying the timing of the mask cancel period PD. After that, when the control circuit 3 determines that the number of the DQS_Mask signal counted by the pulse detection circuit 4 is three (FIG. 7B), the control circuit 3 shifts the mask cancel period PD to the right in FIG. 7B by further adjusting the output of the mask signal. The control circuit 3 repeatedly shifts the mask cancel period PD of the mask signal as described above until the number of pulses of the DQS_Mask signal from the pulse detection circuit 4 becomes the predefined number N1 (FIG. 7C).

When the control circuit 3 determines that number of pulses of the DQS_Mask signal from the pulse detection circuit 4 is equal to the predefined number N1 (Yes at step S103), the control circuit 3 fixes the mask signal at the current signal output and determines the current position as the mask position (position of mask cancel period PD) for the DQS signal (mask position decision step) (step S105).

After that, the control circuit 3 sends a control signal to the select switch 10 to control the select switch 10 to the non-connected state, so that the pull-down resistor 9 is controlled to the Off-state (resistor turn-off step) (step S106). In this way, the connection state between the input signal line 11 of the DQS signal and the ground portion GND is brought to the non-connected state, so that the pull-down resistor 9 is disconnected from the input signal line 11 of the DQS signal. Therefore, it can eliminate such an adverse effect that the waveform of the DQS signal becomes dull by the pull-down resistor 9.

As has been described above, the pull-down resistor 9 is connected to the input signal line 11 to which the DQS signal is input in the pulse detection device 1 in accordance with this exemplary embodiment of the present invention. In this way, the DQS signal can be fixed at the low level in the predefined period during which the DQS signal originally has an intermediate potential, and thereby the DQS signal becomes stable. Therefore, the pulse detection device 1 can count the number of pulses of the DQS signal with high precision.

Furthermore, when the pulse detection circuit 4 is to count the number of pulses of the DQS signal, the control circuit 3 controls the pull-down resistor 9 to the On-state. On the other hand, when the pulse detection circuit 4 is not counting the number of pulses of the DQS signal, the control circuit 3 controls the pull-down resistor 9 to the Off-state.

In this way, when the pulse detection circuit 4 is not counting the number of pulses of the DQS signal, the pull-down resistor 9 can be disconnected from the input signal line 11 of the DQS signal. Therefore, it can eliminate the adverse effect caused to the waveform of the DQS signal by the pull-down resistor 9. That is, it becomes possible to count the number of pulses of the DQS signal with high precision while maintaining the waveform of the DQS signal at an excellent condition.

Next, a modified example of this exemplary embodiment of the present invention is explained hereinafter.

Although a pull-down resistor 9 is connected to the input signal line 11 to which the DQS signal is input in the above-described exemplary embodiment of the present invention, a pull-up resistor may be connected instead of the pull-down resistor.

In this way, the DQS signal can be fixed at a high level in the predefined period during which the DQS signal originally has an intermediate potential, and thereby the DQS signal becomes stable. Therefore, the pulse detection device 1 can count the number of pulses of the DQS signal with high precision. Furthermore, the pull-up resistor may be connected to a power supply portion through the select switch 10. Then, when the pulse detection circuit 4 is to count the number of pulses of the DQS signal, the control circuit 3 may control the select switch 10 to the connected state to control the pull-up resistor to the On-state. On the other hand, when the pulse detection circuit 4 is not counting the number of pulses of the DQS signal, the control circuit 3 may control the select switch 10 to the non-connected state to control the pull-up resistor to the Off-state.

In this way, when the pulse detection circuit 4 is not counting the number of pulses of the DQS signal, the pull-up resistor can be disconnected from the input signal line 11 of the DQS signal. Therefore, it can eliminate such an adverse effect that the waveform of the DQS signal becomes dull by the pull-up resistor.

[Second Exemplary Embodiment]

While the pulse detection device 1 in accordance with the previously-explained exemplary embodiment of the present invention determines the mask position of a DQS signal by using the mask cancel period PD of a mask signal having a fixed length, a pulse detection device 1 in accordance with another exemplary embodiment of the present invention may determines the mask position of a DQS signal by using a mask cancel period PD of a mask signal having a variable length. That is, a pulse detection device 1 in accordance with another exemplary embodiment of the present invention determines the rising edge position and the falling edge position of the mask signal independently from each other. In this way, it is possible to determine the mask cancel period PD of a mask signal with higher precision, and thereby to detect the pulses of a DQS signal with higher precision.

Figure 8:
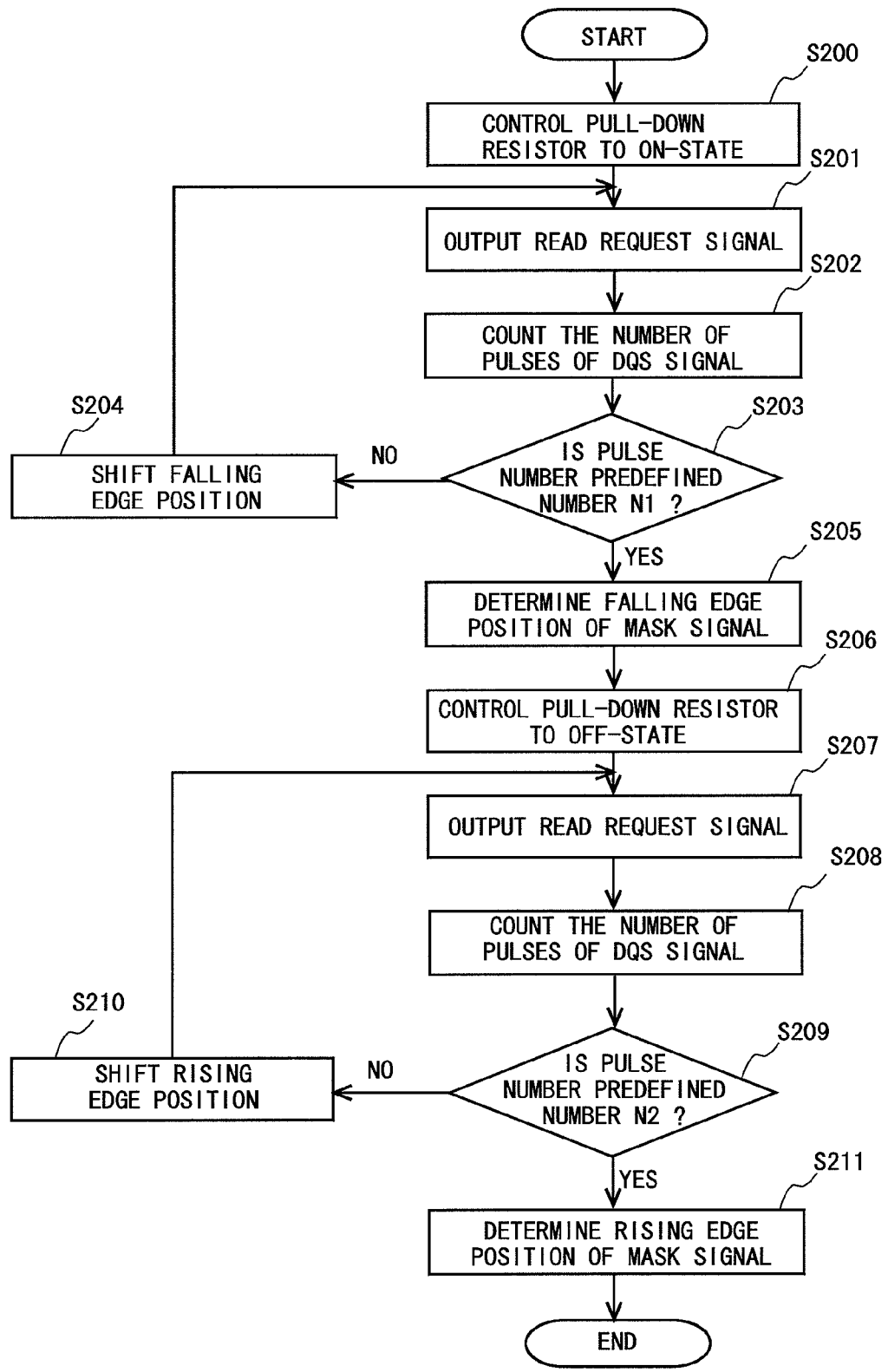
FIG. 8 shows a flowchart illustrating an example of a pulse detection device and a pulse detection method in accordance with another exemplary embodiment of the present invention.

FIG. 8 shows a flowchart illustrating an example of a pulse detection device 1 and a pulse detection method in accordance with another exemplary embodiment of the present invention.

Firstly, the control circuit 3 controls the select switch 10 to the connected state, so that the pull-down resistor 9 is controlled to the On-state (signal fixing step) (step S200). In this way, the connection state between the input signal line 11 of the DQS signal and the ground portion GND is brought to the connected state, so that the DQS signal is fixed at the low level during the predefined period during which the DQS signal originally has an intermediate potential, and thereby the DQS signal becomes stable.

Next, the ASIC 21 outputs a READ request signal to the semiconductor storage device 22 (step S201). Then, the pulse detection circuit 4 counts the number of pulses of the DQS signal (DQS_Mask signal) output from the logical multiplication circuit 7 based on this READ request signal (first pulse detection step) (step S202), and outputs the counted number to the control circuit 3.

The control circuit 3 determines whether or not the number of pulses of the DQS signal from the pulse detection circuit 4 is equal to a predefined number N1 (for example, four pulses) (step S203). When the control circuit 3 determines the number of pulses of the DQS signal from the pulse detection circuit 4 is not equal to the predefined number N1 (No at step S203), the control circuit 3 shifts the falling edge position of the mask signal while keeping the rising edge position at the original position (step S204), and the process returns to the above-described Step S201. Note that the initial value for the mask cancel period PD of the mask signal is set to, for example, roughly the same period as that of the predefined number N1 of pulses of the DQS signal.

For example, when the control circuit 3 determines that the number of the DQS_Mask signal counted by the pulse detection circuit 4 is one (FIG. 9A), the control circuit 3 shifts the falling edge position of the mask signal to the right in FIG. 9A while keeping the rising edge position at the original position. After that, when the control circuit 3 determines that the number of the DQS_Mask signal counted by the pulse detection circuit 4 is three (FIG. 9B), the control circuit 3 further shifts the falling edge position of the mask signal to the right in FIG. 9B while keeping the rising edge position at the original position. The control circuit 3 repeats the shift of the falling edge position of the mask signal as described above until the number of pulses of the DQS_Mask signal from the pulse detection circuit 4 becomes the predefined number N1 (=4 pulses) (FIG. 9C).

When the control circuit 3 determines that number of pulses of the DQS_Mask signal from the pulse detection circuit 4 is equal to the predefined number N1 (Yes at step S203), the control circuit 3 determines the current falling edge position as the falling edge position of the mask signal (falling edge position decision step) (step S205).

After that, the control circuit 3 controls the select switch 10 to the non-connected state, so that the pull-down resistor 9 is controlled to the Off-state (resistor turn-off step) (step S206). In this way, the connection state between the input signal line 11 of the DQS signal and the ground portion GND is brought to the non-connected state, so that the pull-down resistor 9 is disconnected from the input signal line 11 of the DQS signal. Therefore, it can eliminate the adverse effect caused to the waveform of the DQS signal by the pull-down resistor 9.

Furthermore, the ASIC 21 outputs a READ request signal to the semiconductor storage device 22 (step S207). Then, the pulse detection circuit 4 counts the number of pulses of the DQS signal output from the logical multiplication circuit 7 based on this READ request signal (second pulse detection step) (step S208), and outputs the counted number to the control circuit 3.

The control circuit 3 determines whether or not the number of pulses of the DQS signal from the pulse detection circuit 4 is equal to a predefined number N2 (step S209). Note that this predefined number N2 is set to the value expressed as "(the number of pulses of the DQS signal in the READ period)-1". For example, when the number of pulses of the DQS signal in the READ period is four, the predefined number N2 becomes three.

When the control circuit 3 determines the number of pulses of the DQS signal from the pulse detection circuit 4 is not equal to the predefined number N2 (No at step S209), the control circuit 3 shifts the rising edge position of the mask signal while keeping the falling edge position at the current position (step S210), and the process returns to the above-described Step S207.

For example, when the control circuit 3 determines that the number of the DQS_Mask signal counted by the pulse detection circuit 4 is four (FIG. 9D), the control circuit 3 shifts the rising edge position of the mask signal to the right in FIG. 9D while keeping the falling edge position at the current position. Furthermore, when the control circuit 3 determines that the number of the DQS_Mask signal counted by the pulse detection circuit 4 is four (FIG. 9E), the control circuit 3 shifts the rising edge position of the mask signal to the right in FIG. 9E while keeping the rising edge position at the current position. Then, the control circuit 3 repeats the shift of the rising edge of the mask signal as described above until the number of pulses of the DQS_Mask signal from the pulse detection circuit 4 becomes the predefined number N2 (=3 pulses) (FIG. 9F).

When the control circuit 3 determines that number of pulses of the DQS signal from the pulse detection circuit 4 is equal to the predefined number N2 (Yes at step S209), the control circuit 3 determines a position that is obtained by returning the current position by a period corresponding to one pulse of the DQS_Mask signal as the rising edge position of the mask signal (FIG. 9G) (rising edge position decision step) (step S211). In this way, the position of the mask cancel period PD for the DQS signal is determined by determining the rising edge position and the falling edge position of the mask signal, so that the mask position is finally determined.

As has been described above, the pulse detection device 1 in accordance with this exemplary embodiment of the present invention determines the rising edge position and the falling edge position of the mask signal independently from each other. In this way, it is possible to determine the mask cancel period PD of a mask signal with higher precision, and thereby to detect the pulses of a DQS signal with higher precision.

Next, a modified example of the pulse detection device 1 in accordance with this exemplary embodiment of the present invention is explained hereinafter.

Although the falling edge position of a mask signal is firstly determined and then the rising edge is determined in this exemplary embodiment of the present invention, the rising edge position of the mask signal may be determined before the falling edge is determined.

Furthermore, although the pull-down resistor 9 is controlled to the Off-state after the falling edge position of the mask signal is determined, the pull-down resistor 9 may be controlled to the Off-state after both the rising edge and the falling edge of the mask signal are determined.

Note that although the best mode for carrying out the present invention is explained by using certain exemplary embodiments, the present invention is by no means limited to these exemplary embodiments. Various modifications and replacements can be made to the above-described exemplary embodiments without departing from the spirit of the present invention.

For example, although the pulse detection device 1 counts the number of pulses of a DQS signal output from the semiconductor storage device 22 in the above-described exemplary embodiments, the present invention is not limited to this configuration. That is, the present invention is applicable to any apparatuses that output a pulse signal having an intermediate potential in a predefined period.

Furthermore, although the intermediate potential of the pulse signal is fixed at a low level or high level by a pull-down resistor 9 or a pull-up resistor in the above-described exemplary embodiments, the present invention is not limited to these configurations. That is, any means that can fix the intermediate potential of the pulse signal at the low or high level can be used for the same purpose.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A pulse detection device to detect a pulse signal having an intermediate potential in a predefined period, comprising
a signal fixing section that fixes the intermediate potential of the pulse signal at a low level or a high level;
a select switch that switches a pull-down resistor or a pull-up resistor between an On-state and an Off-state;
a pulse detection section that counts a number of pulses of the pulse signal when the select switch is in the On-state; and
a mask position decision section that determines a mask position for the pulse signal based on the number of pulses of the pulse signal counted by the pulse detection section,
wherein the mask position decision section determines the mask position by shifting a mask cancel period having a predefined width so that the number of pulses of the pulse signal counted by the pulse detection section becomes a predefined number, and
wherein the signal fixing section comprises the pull-down resistor or the pull-up resistor connected to an input signal line to which the pulse signal is input.

2. The pulse detection device according to claim 1, wherein the mask position decision section determines the mask position by further including shifting a rising edge position and a falling edge position of a mask signal independently from each other.

3. The pulse detection device according to claim 1,wherein the pulse signal is a data strobe signal output from a semiconductor storage device.

4. A method of detecting a pulse signal having an intermediate potential in a predefined period, comprising
fixing the intermediate potential of the pulse signal at a low level or a high level,
bringing a pull-down resistor or a pull-up resistor connected to an input signal line to which the pulse signal is input to an On-state;

counting a number of pulses of the pulse signal after the pull-down resistor or the pull-up resistor is brought to the On-state;

determining a mask position for the pulse signal by shifting a mask cancel period having a predefined width so that the number of pulses of the pulse signal becomes a predefined number; and bringing the pull-down resistor or the pull-up resistor to an Off-state after determining the mask position.

5. The method of detecting a pulse signal according to claim 4, wherein the determining the mask position for the pulse signal further comprises:

determining a falling edge position of a mask signal for the pulse signal based on the counted number of pulses of the pulse signal;

bringing the pull-down resistor or the pull-up resistor to an Off-state after the falling edge position is determined;

counting the number of pulses of the pulse signal after the pull-down resistor or the pull-up resistor is brought to the Off-state; and determining a rising edge position of the mask signal for the pulse signal based on the counted number of pulses of the pulse signal.

\* \* \* \* \*